United States Patent [19]
Lee et al.

[11] Patent Number: 5,814,151
[45] Date of Patent: Sep. 29, 1998

[54] APPARATUS FOR SPRAYING PHOTORESIST

[75] Inventors: Gyu-myeung Lee, Anyang; Ill-jin Jang, Suwon, both of Rep. of Korea

[73] Assignee: Samsung Electronics Co., Ltd., Suwon, Rep. of Korea

[21] Appl. No.: 825,224

[22] Filed: Mar. 19, 1997

[30] Foreign Application Priority Data

Mar. 19, 1996 [KR] Rep. of Korea .............. 1996 7379

[51] Int. Cl.⁶ .............. B05B 7/00; B05C 11/00; B65D 83/00
[52] U.S. Cl. .............. 118/300; 118/600; 118/685; 222/394; 137/209
[58] Field of Search .............. 137/206, 209, 137/210, 211, 211.5, 212, 588, 583; 251/144; 222/399, 394; 118/600, 300, 685; 239/302, 372, 346

[56] References Cited

U.S. PATENT DOCUMENTS

| | | | |
|---|---|---|---|
| 4,235,829 | 11/1980 | Partus | 137/209 |
| 4,676,404 | 6/1987 | Yamazaki et al. | 222/399 |
| 5,458,895 | 10/1995 | Petronini et al. | 426/231 |
| 5,568,882 | 10/1996 | Takacs | 222/399 |

*Primary Examiner*—Laura Edwards
*Assistant Examiner*—Calvin Padgett
*Attorney, Agent, or Firm*—Jones & Volentine, L.L.P.

[57] ABSTRACT

A photoresist spraying apparatus for coating a photoresist with pressure from a nitrogen gas includes a tank which has a photoresist holding portion and an air portion. A photoresist inflow conduit is connected to a sidewall of the tank to intake photoresist and a photoresist outflow conduit is connected to a bottom of the tank for discharging photoresist. A T-shaped gas conduit has a gas inlet, a gas outlet and a connecting portion therebetween for connecting to the tank. The flow of a gas from the gas inlet to the gas outlet lowers the air pressure inside the tank so that air and bubbles remaining inside the tank are discharged to the gas outlet via the connecting portion, while a photoresist flows into the tank via the photoresist inflow conduit. A valve, provided in the gas outlet of the gas conduit, opens and closes to fill and discharge photoresist in the tank according to the pressure inside the tank. Therefore, the gas flows in the gas conduit responsive to whether the valve is open or closed, and bubbles included in the photoresist inside the tank are easily removed, thereby enhancing the quality of the photoresist coating.

7 Claims, 1 Drawing Sheet

APPARATUS FOR SPRAYING PHOTORESIST

BACKGROUND OF THE INVENTION

1. Field of the Invention

The present invention relates to a photoresist spraying apparatus, and more particularly, to a photoresist spraying apparatus for coating photoresist that is responsive to differing pressures within a photoresist holding tank.

2. Description of the Related Art

The general semiconductor device fabrication method includes a photoresist pattern forming process wherein a photoresist is first coated on a film material, then exposed to light, and then developed in order to pattern the film material formed on a semiconductor wafer. Hereinbelow, a conventional photoresist spraying apparatus for forming a photoresist pattern will be described.

FIG. 1 is a schematic diagram of a conventional photoresist spraying apparatus. The conventional photoresist spraying apparatus includes a cylinder 10 which moves forward and backward by air pressure provided from the outside. A bellows 15 compresses and expands in a predetermined direction in accordance with the forward and backward movement of the cylinder 10. An inflow conduit 30 is connected to the bellows 15, opposite to the cylinder 10, to allow photoresist to flow into the bellows 15. An outflow conduit 35 is also connected to the bellows 15, opposite to the cylinder 10, for discharging the photoresist that flowed into the bellows 15.

In the conventional photoresist spraying apparatus having the above structure, when the cylinder 10 moves backward, or to the left in the orientation shown in FIG. 1, by an external driving force, the bellows 15 expands. When the bellows 15 expands, photoresist flows into and fills the bellows 15 via the inflow conduit 30. Thereafter, a valve (not shown) installed at a predetermined position of the outflow conduit 35 is closed to prevent air from flowing into the bellows 15 from the outflow conduit 35.

When the cylinder 10 moves forward, or to the right in the orientation shown in FIG. 1, by an external driving force, the bellows 15 is compressed to discharge the photoresist within the bellows 15 via the outflow conduit 35. At this time, a valve (not shown) installed at a predetermined position of the inflow conduit 30 is closed to prevent the backward flow of photoresist from within the bellows 15 to the inflow conduit 30. Accordingly, the photoresist is sprayed by consecutively repeating the expansion and compression of the bellows 15.

However, since the bellows 15 used in the conventional photoresist spraying apparatus contains creases to allow it to easily expand and compress, bubbles 25 are generated at the outward creases as a result of such expansion and compression. Such bubbles 25 may cause a coating failure when included in the photoresist coating of a semiconductor wafer. Also, since the operational speed of the bellows 15 may change due to the bubbles 25, a delay in the flow of photoresist to the semiconductor wafer may occur.

SUMMARY OF THE INVENTION

Accordingly, it is an object of the present invention to overcome one or more of the problems in the conventional art by providing a photoresist spraying apparatus which can prevent the inclusion of bubbles in a photoresist coating.

To accomplish these and other objects, there is provided a photoresist spraying apparatus comprising: a tank having a photoresist holding portion and an air portion; a photoresist inflow conduit connected to a sidewall of the tank for intaking photoresist; a photoresist outflow conduit connected to a bottom of the tank for discharging the photoresist; a gas conduit having a gas inlet, a gas outlet and a connecting portion therebetween, the connecting portion being connected to the sidewall of the tank; and a valve, provided in the gas outlet of the gas conduit, for regulating a pressure inside the tank.

According to the present invention, the photoresist spraying apparatus is further comprised of a first pressure detecting sensor provided on an upper part of the tank for detecting an air pressure inside the tank; and a second pressure detecting sensor provided on the photoresist outflow conduit for detecting a pressure of the photoresist being discharged.

Also, it is preferable that a nitrogen gas ($N_2$) is used in the gas conduit.

According to the present invention, a gas flows in a gas conduit in accordance with the action of the valve, and thus easily removes bubbles from the photoresist within a tank, thereby improving the quality of the photoresist coating.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
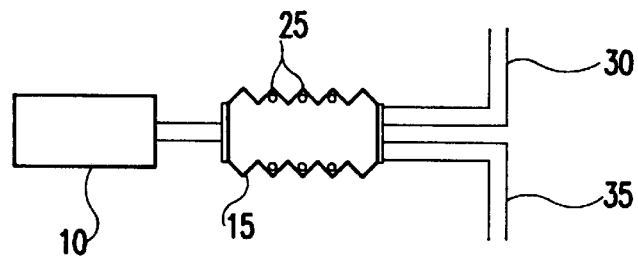
FIG. 1 is a schematic diagram of a conventional photoresist spraying apparatus.
Figure 2:
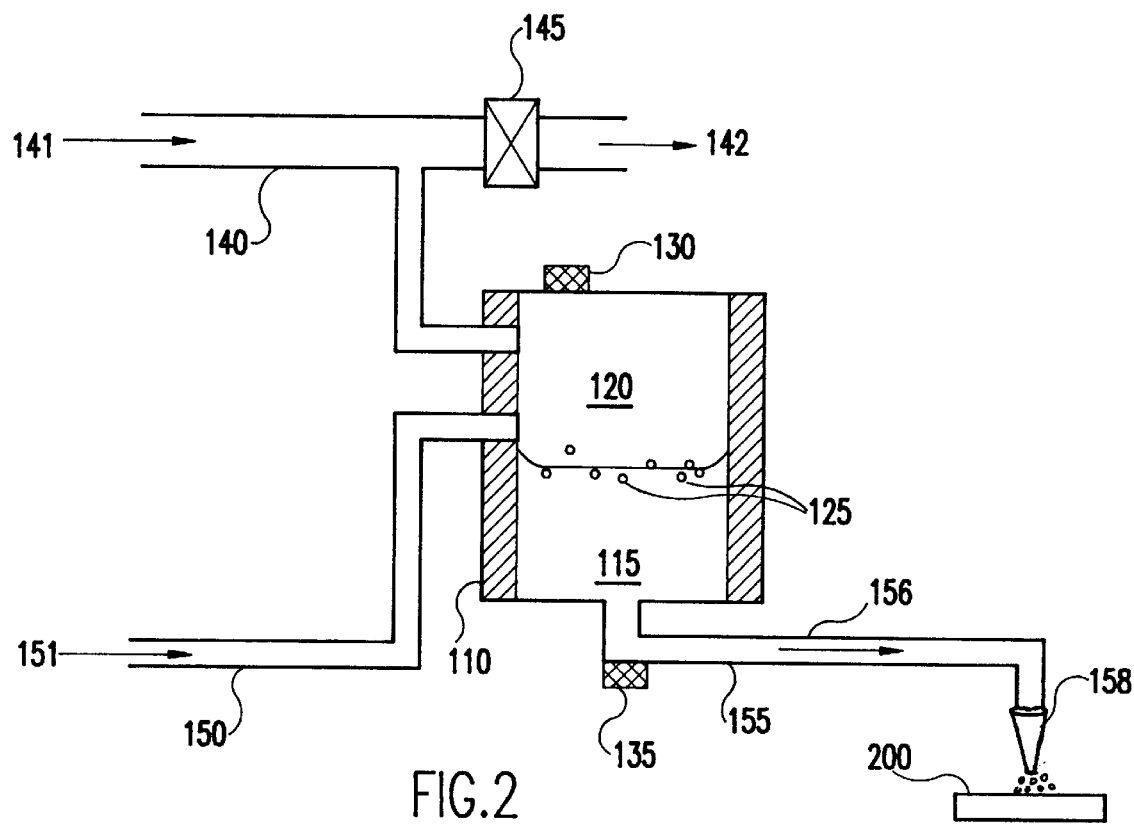
FIG. 2 is a schematic diagram of a photoresist spraying apparatus according to the present invention.

Referring to FIG. 2, the photoresist spraying apparatus according to the present invention includes a tank 110 partially filled with a photoresist 115 having bubbles 125 therein. A gas conduit 140 injects a gas into the tank 110, and a photoresist inflow conduit 150 injects a photoresist from an external source. A photoresist outflow conduit 155 discharges the photoresist in the tank 110.

A first pressure detecting sensor 130, provided at the upper end of the tank 110, detects an air pressure of an air portion 120 in the tank. A second pressure detecting sensor 135, provided at the lower end of the tank 110 or on the photoresist outflow conduit 155, detects the pressure at which the photoresist 115 is discharged from the tank 110.

The gas conduit 140 includes a gas inlet 141 and a gas outlet 142, and is connected to the air portion 120 via a connecting inlet portion 141a. Note that the inlet portion 141a in FIG. 2 is connected to the gas conduit 140 at approximately a right angle, thereby forming a T-shape. It is understood, however, that within the scope of the present invention, the inlet portion 141a need not be substantially perpendicular to the main branch of the gas conduit 140, and it may be oriented at some other angle to create a Y-shape, for example. A valve 145, which opens and closes in accordance with the air pressure in the air portion 120, is provided at a predetermined position of the gas outlet 142. Also, the photoresist inflow conduit 150 has a photoresist inlet 151, and the photoresist outflow conduit 155 has a photoresist outlet 156.

The action of the photoresist spraying apparatus according to the present invention will be described with reference to FIG. 2.

First, when the valve 145 is opened, a gas, for example, nitrogen (N$_2$) gas, flows in via the gas inlet 141 of the gas conduit 140. As the nitrogen gas flows out via the gas outlet 142 it creates a suction in the inlet portion 141a connected to the tank 110. Air within the tank 110 thus flows out via the gas outlet 142, thereby lowering the internal pressure inside the tank 110. Accordingly, a photoresist flows into the tank 110 via the photoresist inflow conduit 150.

The bubbles 125, which are generated on the surface of the photoresist 115 by the inflow of photoresist, also flow out of the tank via the gas outlet 142 of the gas conduit 140 together with the air of the air portion 120. This is due to the pressure difference caused by the gas flow in the gas conduit 140, in contrast to the conventional technology. Accordingly, there are no bubbles 125 in the photoresist 115 that is discharged via the photoresist outflow conduit 155. Also, the amount of nitrogen gas provided via the gas inlet 141 may be adjusted, depending on the air pressure inside the tank 110 that is detected by the first pressure detecting sensor 130.

When the valve 145 is closed, the nitrogen gas introduced via the gas inlet 141 of the gas conduit 140 flows into the tank 110 via the inlet portion 141a. As such, the photoresist 115 within the tank 110 is sprayed onto the semiconductor wafer 200 via a nozzle 158 connected to the photoresist outlet 156 of the photoresist outflow conduit 155 due to the pressure inside the tank.

The pressure of the sprayed photoresist 115 is detected by the second pressure detecting sensor 135. The amount of nitrogen gas provided via the gas inlet 141 may be adjusted, depending on the pressure detected by the sensor 135. With the present invention, therefore, the air portion 120 is at a normal air pressure when there is no inflow or outflow operations in the tank 110. If there is an inflow or outflow operation in the tank 110, the air pressure varies depending on whether the valve 145 is open or closed.

As described above, since the present invention employs a tank, rather than an adjustable bellows, from which the photoresist is filled and discharged from, and since the air pressure within the tank is adjustable, bubbles are prevented from being included in the photoresist to be sprayed on a semiconductor wafer. Therefore, the quality of the photoresist coating can be enhanced.

The present invention is not limited to the above embodiment, and it is apparent that various changes may be effected by those skilled in the art within the technical spirit of the present invention.

What is claimed is:

1. A photoresist spraying apparatus comprising:

a tank having a photoresist holding portion and an air portion located above said photoresist holding portion;

photoresist inflow conduit connected to a sidewall of the photoresist holding portion of the tank for admitting a photoresist to the photoresist holding portion of the tank;

a photoresist outflow conduit connected to the bottom of the photoresist holding portion of the tank for discharging the photoresist to a nozzle for spraying the photoresist onto a semiconductor wafer, a gas conduit having a gas inlet, a gas outlet and a connecting portion therebetween, the connecting portion being connected to the sidewall of the air portion of the tank and not extending inside the tank; and a valve, provided in the gas outlet of the gas conduit, for regulating a pressure inside the tank.

2. A photoresist spraying apparatus as claimed in claim 1, further comprising a first pressure detecting sensor provided on an upper part of said tank for detecting an air pressure inside said tank; and a second pressure detecting sensor provided on said photoresist outflow conduit for detecting a pressure of the photoresist being discharged.

3. A photoresist spraying apparatus as claimed in claim 2, wherein said connecting portion connects to said air portion in said tank at a position higher than said photoresist inflow conduit, wherein a flow of a gas from said gas inlet to said gas outlet thereby lowers the air pressure inside said tank so that air and bubbles remaining inside said tank are discharged to said gas outlet via said connecting portion, and wherein the photoresist flows into said tank via said photoresist inflow conduit.

4. A photoresist spraying apparatus as claimed in claim 3, where said valve opens and closes to fill and discharge photoresist in said tank according to the pressure inside said tank.

5. A photoresist spraying apparatus as claimed in claim 3, wherein the gas used in said gas conduit is nitrogen gas (N$_2$).

6. A photoresist spraying apparatus as claimed in claim 1, wherein said gas conduit is T-shaped.

7. A photoresist spraying apparatus as claimed in claim 1, wherein said gas conduit is Y-shaped.

* * * * *